United States Patent
Zhang et al.

(10) Patent No.: US 11,139,831 B2
(45) Date of Patent: Oct. 5, 2021

(54) FAST FAIL SUPPORT FOR ERROR CORRECTION IN NON-VOLATILE MEMORY

(71) Applicant: SK hynix Inc., Icheon-Si (KR)

(72) Inventors: Fan Zhang, San Jose, CA (US);
Chenrong Xiong, San Jose, CA (US);
Xuanxuan Lu, San Jose, CA (US);
Meysam Asadi, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 117 days.

(21) Appl. No.: 16/526,784

(22) Filed: Jul. 30, 2019

(65) Prior Publication Data

US 2021/0036716 A1 Feb. 4, 2021

(51) Int. Cl.
*H03M 13/11* (2006.01)
*H03M 13/00* (2006.01)
*G06F 11/00* (2006.01)
*G06F 11/10* (2006.01)
*G06F 3/06* (2006.01)

(52) U.S. Cl.
CPC ..... *H03M 13/1108* (2013.01); *G06F 11/1004* (2013.01)

(58) Field of Classification Search
CPC combination set(s) only.
See application file for complete search history.

(56) References Cited

U.S. PATENT DOCUMENTS

| | | | |
|---|---|---|---|
| 9,053,025 B2 * | 6/2015 | Ben-Kiki | G06F 11/1438 |
| 10,153,786 B1 | 12/2018 | Nguyen et al. | |
| 2019/0068219 A1 | 2/2019 | Bhatia et al. | |
| 2020/0127685 A1 * | 4/2020 | Chen | H03M 13/152 |
| 2020/0373944 A1 * | 11/2020 | Cho | G06F 3/0659 |

* cited by examiner

*Primary Examiner* — Justin R Knapp
(74) *Attorney, Agent, or Firm* — Perkins Coie LLP (57) ABSTRACT

Disclosed are devices, systems and methods for improving fast fail support for error correction in non-volatile memory. An exemplary method includes (a) receiving a codeword from a read operation in a fast fail mode, (b) initially configuring a maximum number of iterations ($N_{max}$) and a set of values for a plurality of bit flipping thresholds for performing a decoding operation on the codeword, (c) performing a plurality of decoding iterations (N), each iteration using a subset of bit flipping thresholds, (d) calculating a remaining number of iterations ($N_{rem}$) as a difference between $N_{max}$ and N, (e) reconfiguring, based on $N_{rem}$ and a latency requirement of the read operation in the fast fail mode, the set of values for the plurality of bit flipping thresholds to restart the decoding operation, and (f) repeating operations (c) through (e) until the codeword is successfully decoded or $N_{rem}$ is less than or equal to 0.

20 Claims, 9 Drawing Sheets

FAST FAIL SUPPORT FOR ERROR CORRECTION IN NON-VOLATILE MEMORY

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, the multi-level NAND flash devices can be inherently unreliable and generally need to use ECCs to allow dramatic increase in data reliability at the expense of extra storage space for ECC parity bits. There is a demand for increasingly efficient ECCs and control mechanisms that provide the most data protection for the least parity and latency requirements.

SUMMARY

Embodiments of the disclosed technology relate to supporting fast fail for error correction in non-volatile memory devices. The methods and devices described in the present document advantageously enable the fast fail operation to adapt to the number of remaining iterations of the ECC decoder while maintaining the stringent latency requirements.

The present document provides methods, devices and systems for fast fail support for error correction in non-volatile memory devices. In an example aspect, a method for improved error correction in a non-volatile memory includes (a) receiving a codeword from a read operation in a fast fail mode; (b) initially configuring a maximum number of iterations and a set of values for a plurality of bit flipping thresholds for performing a decoding operation on the codeword; (c) performing a plurality of decoding iterations, each iteration using a subset of bit flipping thresholds; (d) calculating a remaining number of iterations as a difference between the maximum number of iterations and the plurality of decoding iterations already performed; (e) reconfiguring, based on the remaining number of iterations and a latency requirement of the read operation in the fast fail mode, the set of values for the plurality of bit flipping thresholds to restart the decoding operation; and (f) repeating operations (c) through (e) until the codeword is successfully decoded or the remaining number of iterations is less than or equal to zero.

In another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Solid state devices (SSDs) consistently outperform hard drives, although they tend to have 10× worse quality-of-service (QoS) than hard drives as well. To address the QoS issue, existing standards and implementations (e.g., the Non-Volatile Memory (NVM) Express Specification) have developed a fast fail (FF) mode, which is a requirement to terminate the internal processing of a command within a certain latency.

In an example, the usage scenario of the fast fail mode entails the host issuing fast fail read commands to multiple SSDs to fetch the same piece of data from the same logical block address (LBA). If one of these commands succeeds, the host can get data back within a short latency. However, if all the FF commands fail, the host will issue a normal read or another FF command with longer latency requirement to get data.

In previous ECC decoders, the maximum latency is fixed and the decoder is typically optimized to achieve the best error correction performance given that maximum latency. However, with FF mode enabled, embodiments of the disclosed technology take into account the variable maximum latency, thereby optimizing operations when FF is enabled.

FIGS. 1-6 overview a non-volatile memory system in which embodiments of the disclosed technology may be implemented.

Figure 1:
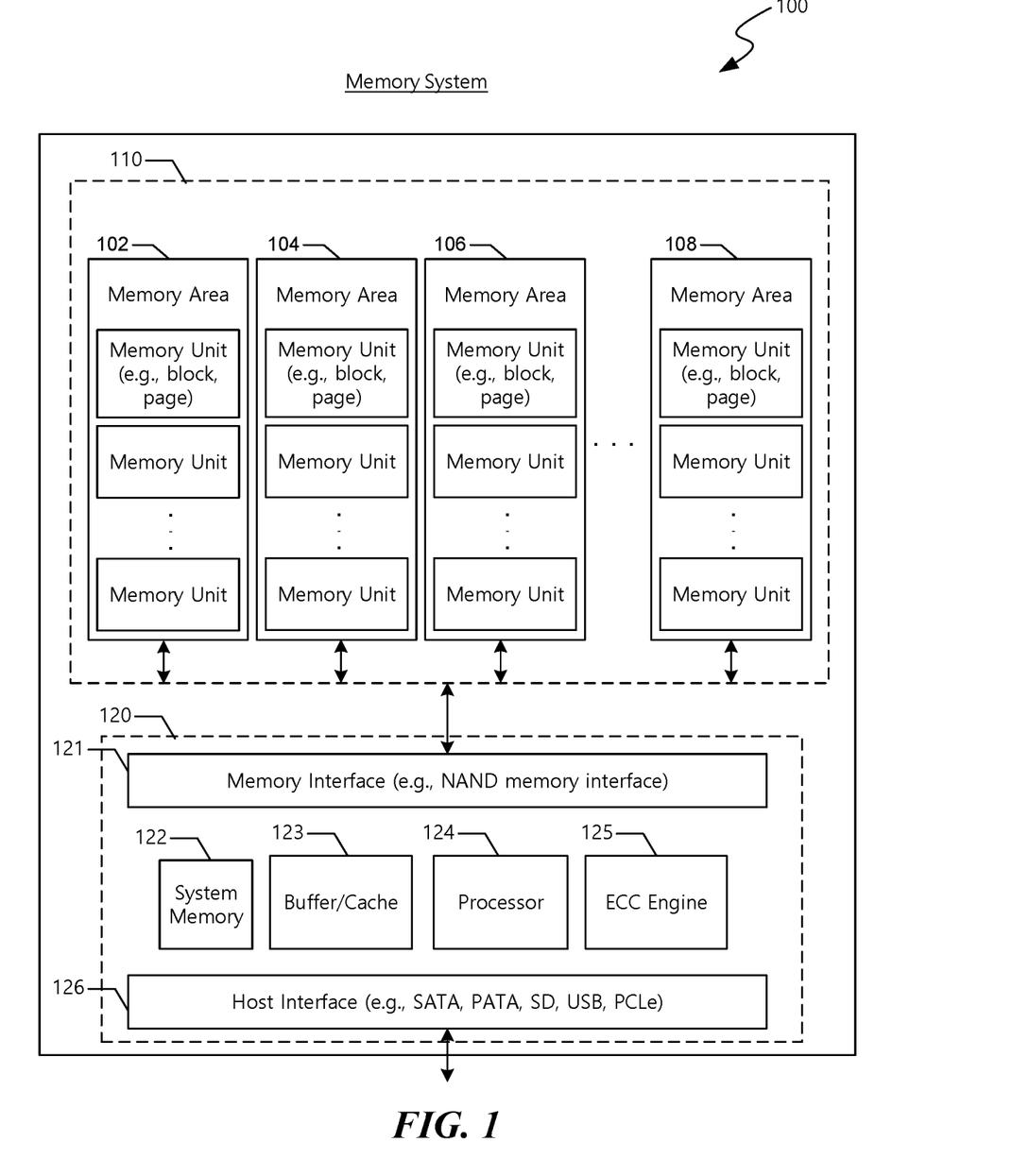
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block bases.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
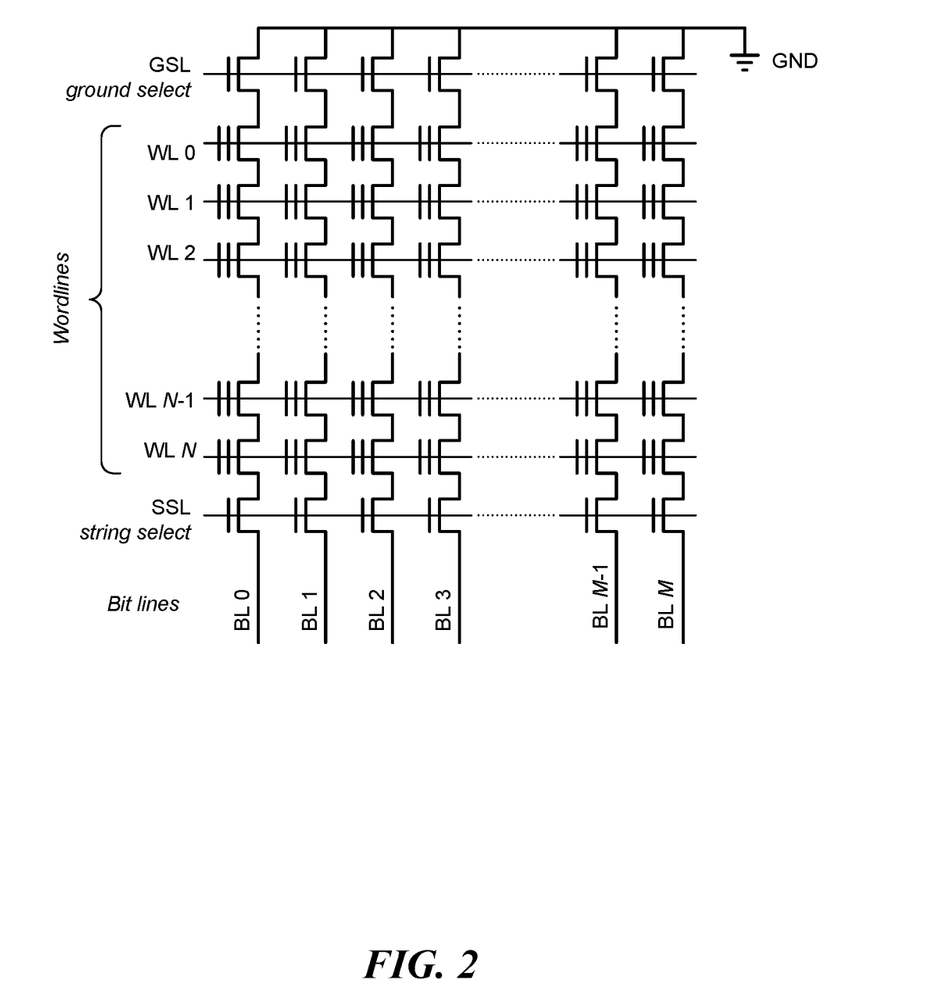
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
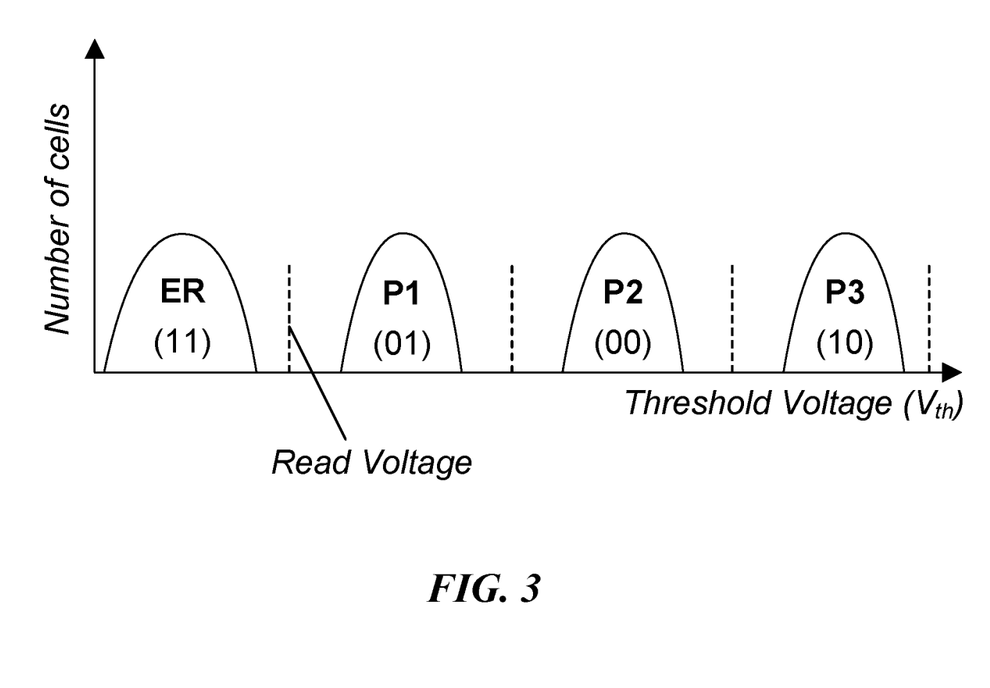
FIG. 3 is an example diagram illustrating the cell voltage level distribution ($V_{th}$) of a non-volatile memory device.

FIG. 3 illustrates an example of threshold voltage distribution curves in a multi-level cell device.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (PE) cycle, cell-to-cell interference, and data retention errors, which will be discussed in the following, and such read errors may be managed in most situations by using error correction codes (ECC).

Figure 4:
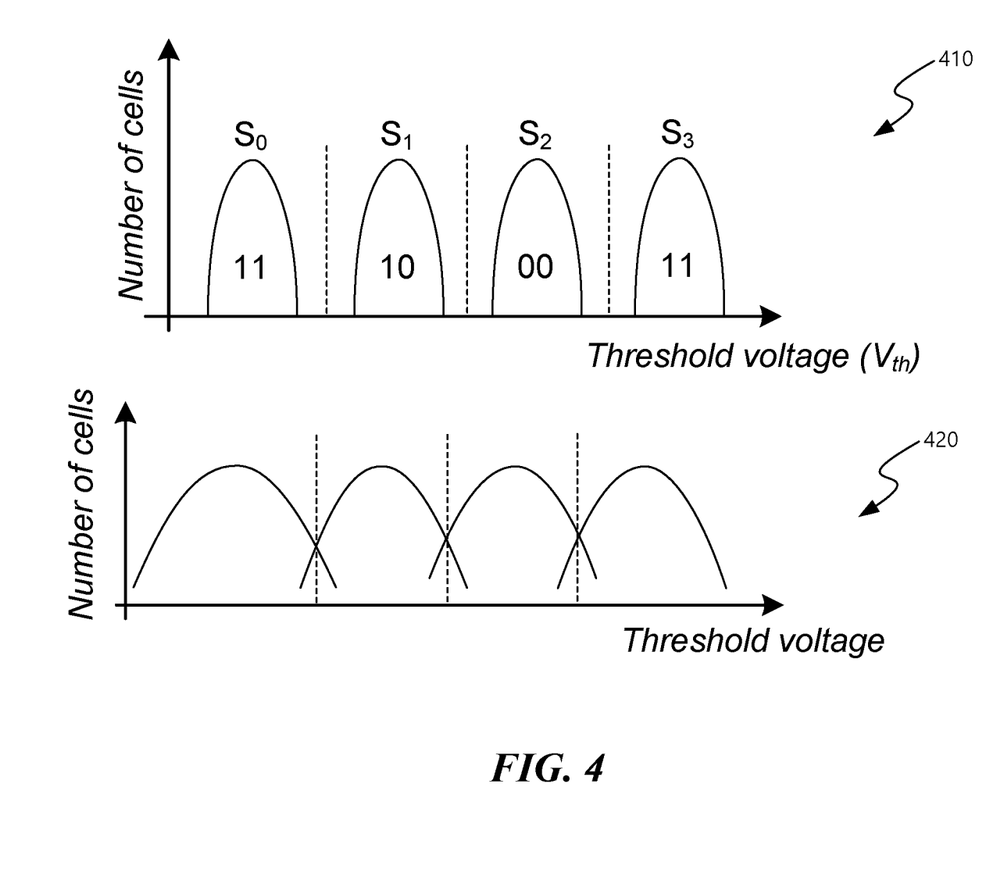
FIG. 4 is another example diagram illustrating the cell voltage level distribution ($V_{th}$) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
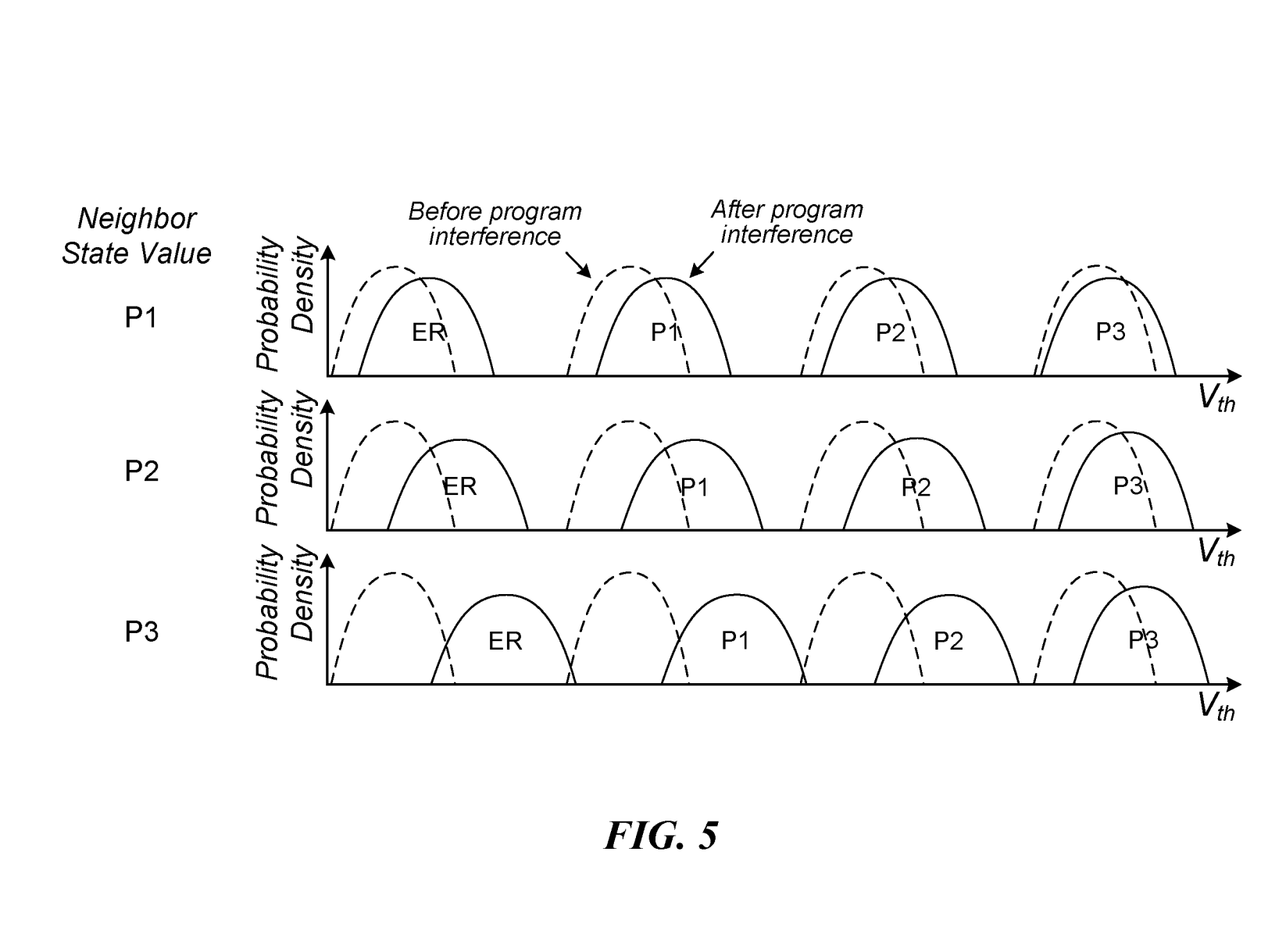
FIG. 5 is an example diagram illustrating the cell voltage level distribution ($V_{th}$) of a non-volatile memory device before and after program interference.

FIG. 5 illustrates an example of a cell-to-cell interference in NAND flash memory.

The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffers less cell-to-cell inference than even cells in the even/odd bit-line structure, and the all-bit-line structure can effectively support high-speed current sensing to improve the memory read and verify speed.

Figure 6:
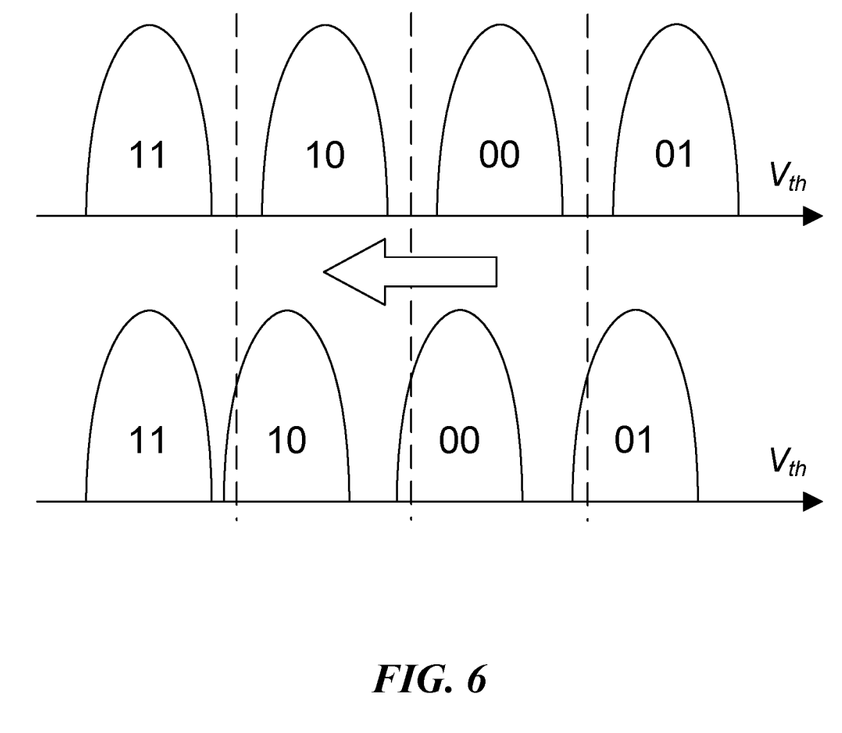
FIG. 6 is an example diagram illustrating the cell voltage level distribution ($V_{th}$) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors.

In some embodiments, the retention errors described in FIGS. 5 and 6 (due to, for example, P/E cycling) require the ECC to ensure that the bits that are stored are read correctly. However, latency requirements for certain applications require the host (e.g., using the host interface 126 in FIG. 1) to implement the fast fail (FF) mode, which is one of the supported Read Recovery Levels (RRLs) that is described in current standards and specification (e.g., the NVM Express Specification).

For example, if RRLs are supported then a "Read Recovery Levels Supported" bitfield, as illustrated in Table 1, is supported. If a bit is set to '1', then the corresponding Read Recovery Level is supported. If a bit is cleared to '0', then the corresponding Read Recovery Level is not supported.

TABLE 1

Bitfield for Read Recovery Levels Supported

| Bit | Definition |
| --- | --- |
| 0 | Read Recovery Level 0 |
| 1 | Read Recovery Level 1 |
| 2 | Read Recovery Level 2 |
| 3 | Read Recovery Level 3 |
| 4 | Read Recovery Level 4 - Default[1] |
| 5 | Read Recovery Level 5 |
| 6 | Read Recovery Level 6 |
| 7 | Read Recovery Level 7 |
| 8 | Read Recovery Level 8 |
| 9 | Read Recovery Level 9 |
| 10 | Read Recovery Level 10 |
| 11 | Read Recovery Level 11 |
| 12 | Read Recovery Level 12 |
| 13 | Read Recovery Level 13 |
| 14 | Read Recovery Level 14 |
| 15 | Read Recovery Level 15 - Fast Fail[1] |

NOTE:
[1]If Read Recovery Levels are supported, then this bit shall be set to '1'.

The Read Recovery Level (RRL) is a configurable attribute that balances the completion time for read commands and the amount of error recovery applied to those read commands. The RRL feature lets the host system configure how hard the SSD should try to recover corrupted data. SSDs usually have several layers of error correction, each more robust but slower and more power-hungry than the last. In a RAID-1 or similar scenario, the host system will usually prefer to get an error quickly so it can try reading the same data from the other side of the mirror rather than wait for the drive to re-try a read and fall back to slower levels of ECC. In an example, there are 16 levels that may be supported.

Level 0, if supported, provides the maximum amount of recovery.

Level 4 is a mandatory level that provides a nominal amount of recovery and is the default level.

Level 15 is a mandatory level that provides the minimum amount of recovery and is referred to as the 'Fast Fail' level.

The levels are organized based on the amount of recovery supported, such that a higher numbered level provides less recovery than the preceding lower level. In an example, there is a maximum latency associated with each of the recovery levels.

In some embodiments, the FF mode fails the command immediately. That is, at the first indication of the need for recovery, the read operation is not retried with a different threshold voltage ($V_t$), error correction is not applied, and parity correction is not applied. Instead, the host relies on another copy or shard to complete the read (or application) request.

In some embodiments, one naïve approach to support the FF mode is to set a different maximum number of decoder iterations for each of the recovery level. However, with existing decoder implementations, this typically leads to a significant increase in the codeword failure rate (CFR) in low latency recovery levels. Embodiments of the disclosed technology include decoder architectures that minimize CFR for a given latency requirement.

Figure 7:
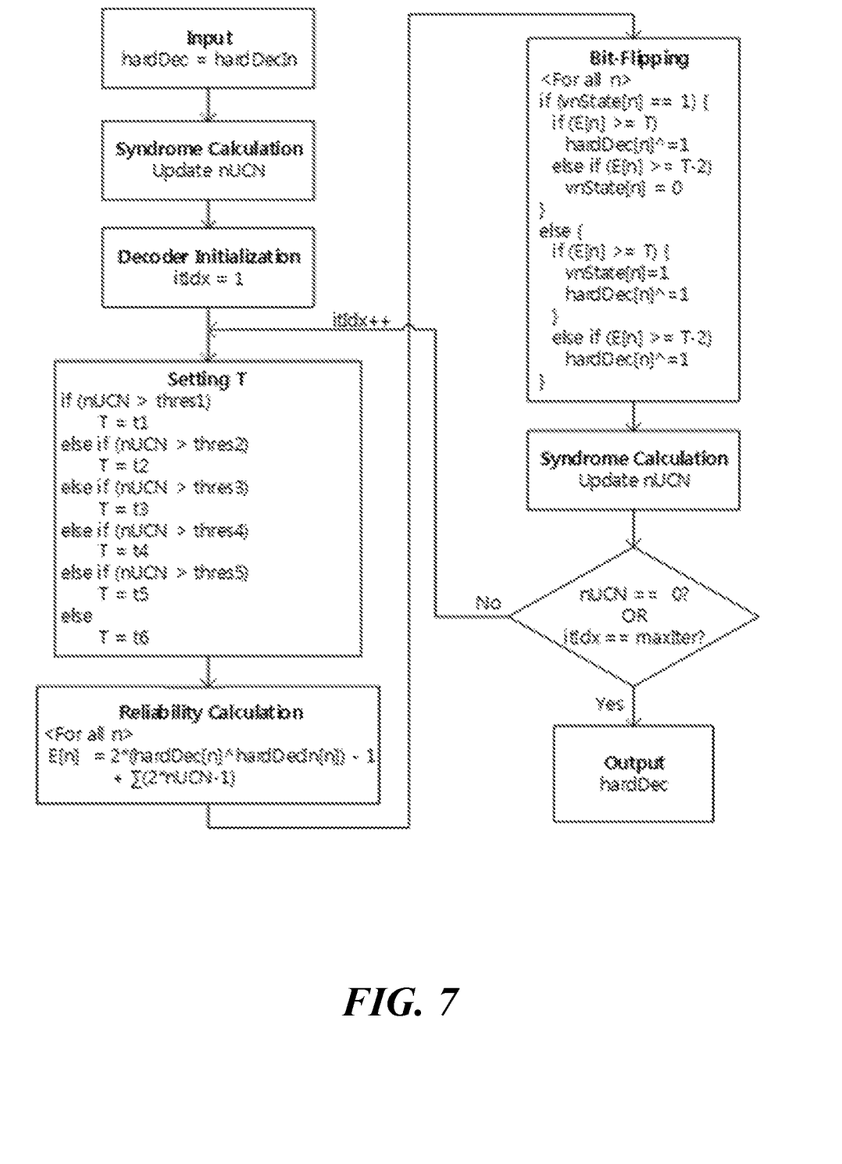
FIG. 7 is a flowchart illustrating the operation of a bit-flipping decoder.

FIG. 7 is a flowchart illustrating the operation of a bit-flipping decoder, which includes a finite state machine (FSM) that controls the bit-flipping threshold (T). In the example illustrated in FIG. 7, the FSM is static and does not adapt or change, regardless of the maximum latency. Typically, the FSM and the bit-flipping threshold(s) affect the bit-flipping decoder's correction capability and its convergence behavior.

As illustrated in FIG. 7, the operation of the bit-flipping decoder includes a syndrome calculation, which updates the number of unsatisfied check nodes (nUCN). In an example, nUCN is representative of the number of errors in the syndrome. That is, if nUCN=0, then the received codeword has been decoded correctly. On the other hand, if nUCN≠0, then there are errors in the decoded codeword, and processing must continue.

After the initial calculation of the syndrome, the decoder is initialized. In an example, the parameters of the decoder that are initialized include number of iterations, one or more bit-widths of the log likelihood ratios (LLRs) in the decoder, the bit-flipping thresholds, and the like.

In some embodiments, the decoder initialization is followed by setting the bit-flipping thresholds of the FSM based on the number of unsatisfied check nodes (nUCN) and a reliability calculation based on nUCN and the current estimate of the hard decision (denoted hardDec in FIG. 7). The thresholds and reliability are used to perform the bit-flipping process for the current iteration, which is followed by a syndrome calculation.

If the syndrome calculation after the bit-flipping operation results in identifying no errors (e.g., nUCN=0), then the hard decision is output. Alternatively, if the decoded codeword still contains an error (e.g., nUCN≠0) and the maximum number of decoder iterations has not been exceeded, then the bit-flipping thresholds are updated based on the remaining number of iterations (or equivalently, the remaining latency budget).

For example, if x denotes the number of remaining iterations, the bit-flipping thresholds of the FSM may be dynamically updated, as function of x, as:

FSM=[20, 40, 80, 100, 120, 200] for x<10,
FSM=[55, 60, 88, 100, 150, 250] for 10≤x<20,
FSM=[60, 77, 80, 110, 210, 300] for 20≤x<40,
FSM=[80, 85, 95, 150, 200, 400] for 40≤x.

This example illustrates that the bit-flipping thresholds increase as the remaining number of iterations decrease.

Figure 8:
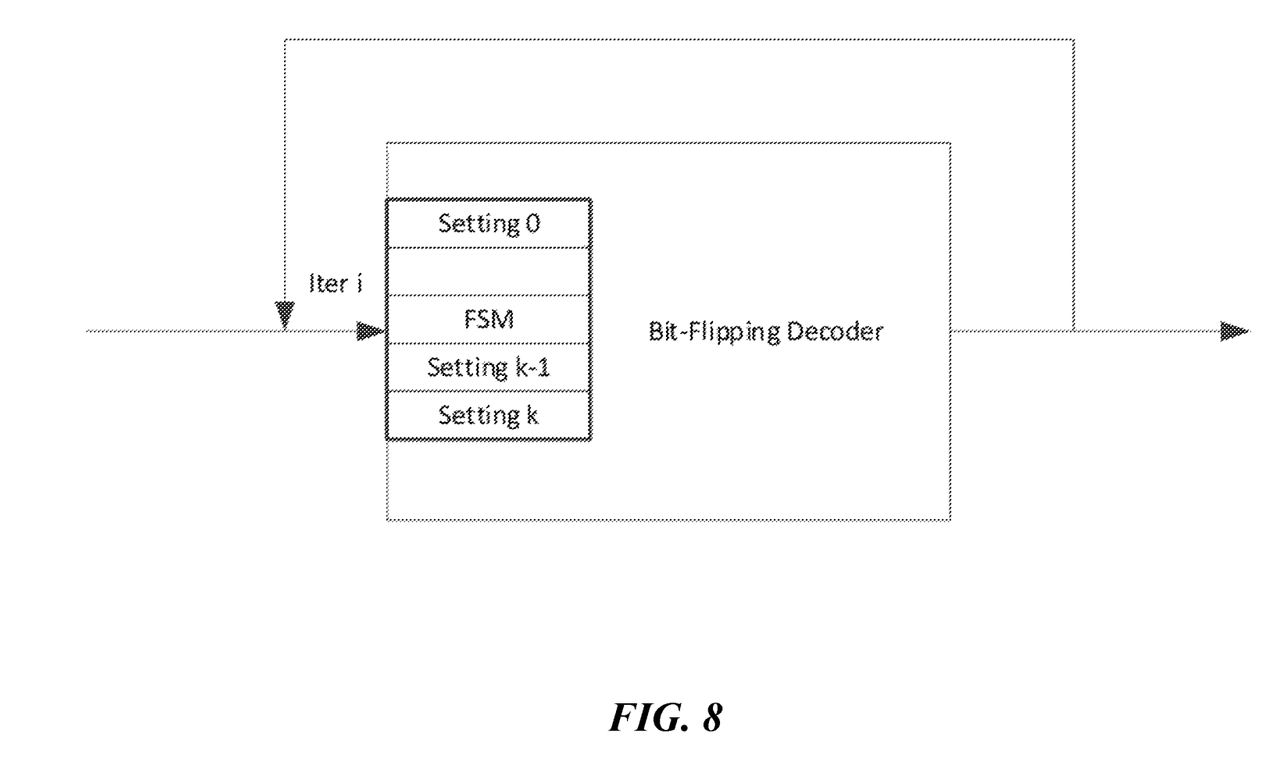
FIG. 8 is an example architecture of a bit-flipping decoder, in accordance with embodiments of the presently disclosed technology.

FIG. 8 is an example architecture of a bit-flipping decoder. As illustrated therein, the FSM includes k+1 settings (denoted Setting 0, . . . , Setting k−1, Setting k), one of which is selected based on the remaining number of iterations, which is fed back at the completion of each decoding iteration.

Figure 9:
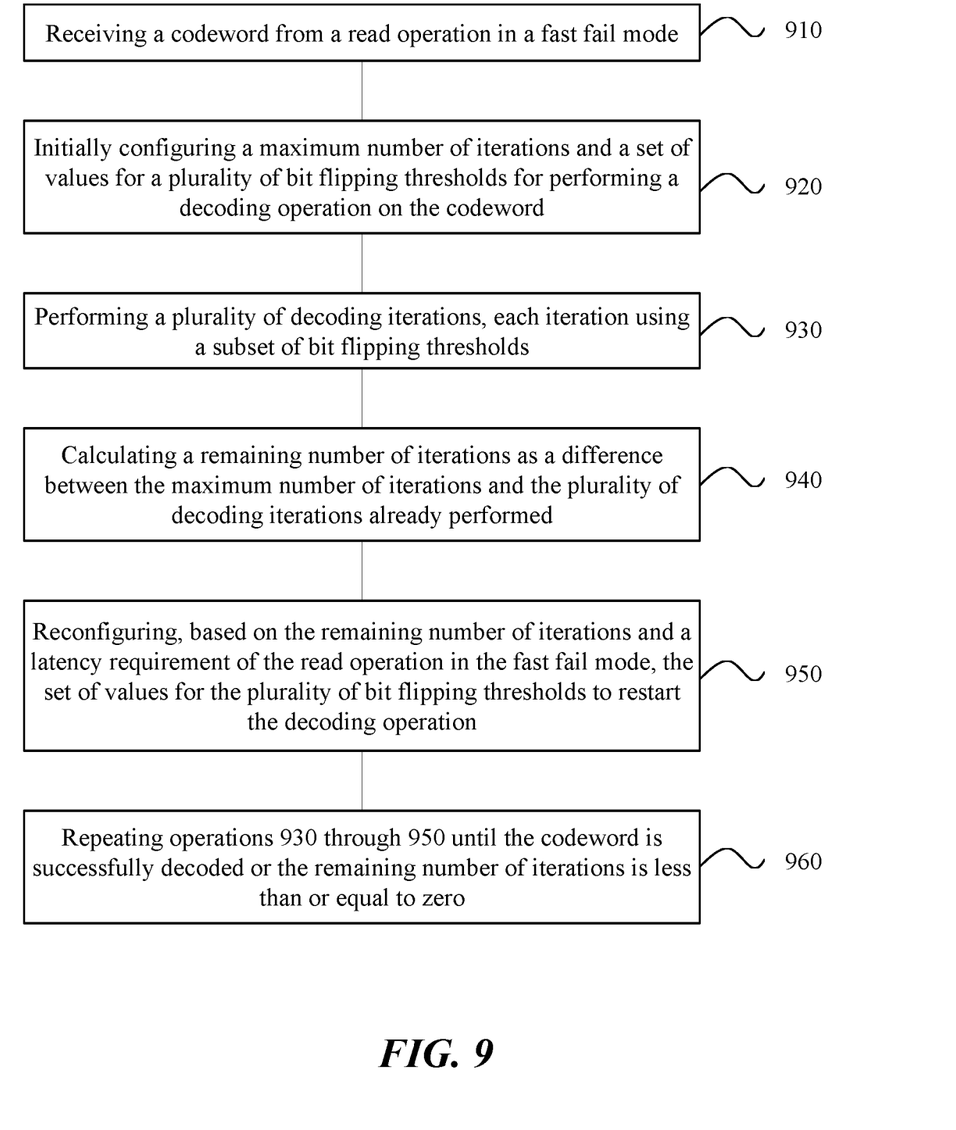
FIG. 9 illustrates a flowchart of another example method for improving error correction in a non-volatile memory.

FIG. 9 illustrates a flowchart of a method 900 for improving error correction in a non-volatile memory. The method 900 includes, at operation 910, receiving a codeword from a read operation in a fast fail mode.

The method 900 includes, at operation 920, initially configuring a maximum number of iterations and a set of values for a plurality of bit flipping thresholds for performing a decoding operation on the codeword.

The method 900 includes, at operation 930, performing a plurality of decoding iterations, each iteration using a subset of bit flipping thresholds.

The method 900 includes, at operation 940, calculating a remaining number of iterations as a difference between the maximum number of iterations and the plurality of decoding iterations already performed.

The method 900 includes, at operation 950, reconfiguring, based on the remaining number of iterations and a latency requirement of the read operation in the fast fail mode, the set of values for the plurality of bit flipping thresholds to restart the decoding operation.

The method 900 includes, at operation 960, repeating operations 930 through 950 until the codeword is successfully decoded or the remaining number of iterations is less than or equal to zero.

In some embodiments, a convergence rate and a correction capability of the decoding operation is based on the set of values for the plurality of bit-flipping thresholds.

In some embodiments, each of the subset of bit flipping thresholds increases as the remaining number of iterations decreases.

In some embodiments, the fast fail mode is a read recovery level (RRL) of the non-volatile memory, and a maximum latency of the fast fail mode is smaller than a maximum latency of any other RRL supported by the non-volatile memory. In an example, the maximum number of iterations is based on the maximum latency of the fast fail mode.

In some embodiments, the non-volatile memory is a NAND flash memory. In an example, the NAND flash memory comprises a plurality of memory cells, each memory cell configured to store more than one bit of data.

In some embodiments, the codeword is a generalized low-density parity-check (G-LDPC) codeword.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improved error correction in a non-volatile memory, comprising:
   (a) receiving a codeword from a read operation in a fast fail mode;
   (b) initially configuring a maximum number of iterations and a set of values for a plurality of bit flipping thresholds for performing a decoding operation on the codeword;
   (c) performing a plurality of decoding iterations, each iteration using a subset of bit flipping thresholds;
   (d) calculating a remaining number of iterations as a difference between the maximum number of iterations and the plurality of decoding iterations already performed;
   (e) reconfiguring, based on the remaining number of iterations and a latency requirement of the read operation in the fast fail mode, the set of values for the plurality of bit flipping thresholds to restart the decoding operation; and
   (f) repeating operations (c) through (e) until the codeword is successfully decoded or the remaining number of iterations is equal to zero.

2. The method of claim 1, wherein a convergence rate and a correction capability of the decoding operation is based on the set of values for the plurality of bit flipping thresholds.

3. The method of claim 1, wherein each of the subset of bit flipping thresholds increases as the remaining number of iterations decreases.

4. The method of claim 1, wherein the fast fail mode is a read recovery level (RRL) of the non-volatile memory, and wherein a maximum latency of the fast fail mode is smaller than a maximum latency of any other RRL supported by the non-volatile memory.

5. The method of claim 4, wherein the maximum number of iterations is based on the maximum latency of the fast fail mode.

6. The method of claim 1, wherein the non-volatile memory is a NAND flash memory.

7. The method of claim 6, wherein the NAND flash memory comprises a plurality of memory cells, each memory cell configured to store more than one bit of data.

8. The method of claim 1, wherein the codeword is a generalized low-density parity-check (G-LDPC) codeword.

9. A system for improved error correction in a non-volatile memory, comprising:
   a processor and a memory including instructions stored thereupon, wherein the instructions upon execution by the processor cause the processor to:
   (a) receive a codeword from a read operation in a fast fail mode;
   (b) initially configure a maximum number of iterations and a set of values for a plurality of bit flipping thresholds for performing a decoding operation on the codeword;
   (c) perform a plurality of decoding iterations, each iteration using a subset of bit flipping thresholds;
   (d) calculate a remaining number of iterations as a difference between the maximum number of iterations and the plurality of decoding iterations already performed;
   (e) reconfigure, based on the remaining number of iterations and a latency requirement of the read operation in the fast fail mode, the set of values for the plurality of bit flipping thresholds to restart the decoding operation; and
   (f) repeat operations (c) through (e) until the codeword is successfully decoded or the remaining number of iterations is equal to zero.

10. The system of claim 9, wherein a convergence rate and a correction capability of the decoding operation is based on the set of values for the plurality of bit flipping thresholds.

11. The system of claim 9, wherein each of the subset of bit flipping thresholds increases as the remaining number of iterations decreases.

12. The system of claim 9, wherein the fast fail mode is a read recovery level (RRL) of the non-volatile memory, and wherein a maximum latency of the fast fail mode is smaller than a maximum latency of any other RRL supported by the non-volatile memory.

13. The system of claim 12, wherein the maximum number of iterations is based on the maximum latency of the fast fail mode.

14. The system of claim 9, wherein the non-volatile memory is a NAND flash memory comprising a plurality of memory cells, each memory cell configured to store more than one bit of data.

15. A non-transitory computer-readable storage medium having instructions stored thereupon for improved error correction in a NAND flash memory, comprising:
   (a) instructions for receiving a codeword from a read operation in a fast fail mode;
   (b) instructions for initially configuring a maximum number of iterations and a set of values for a plurality of bit flipping thresholds for performing a decoding operation on the codeword;
   (c) instructions for performing a plurality of decoding iterations, each iteration using a subset of bit flipping thresholds;

(d) instructions for calculating a remaining number of iterations as a difference between the maximum number of iterations and the plurality of decoding iterations already performed;

(e) instructions for reconfiguring, based on the remaining number of iterations and a latency requirement of the read operation in the fast fail mode, the set of values for the plurality of bit flipping thresholds to restart the decoding operation; and (f) instructions for repeating operations (c) through (e) until the codeword is successfully decoded or the remaining number of iterations is equal to zero.

16. The storage medium of claim 15, wherein a convergence rate and a correction capability of the decoding operation is based on the set of values for the plurality of bit flipping thresholds.

17. The storage medium of claim 15, wherein each of the subset of bit flipping thresholds increases as the remaining number of iterations decreases.

18. The storage medium of claim 15, wherein the fast fail mode is a read recovery level (RRL) of the non-volatile memory, and wherein a maximum latency of the fast fail mode is smaller than a maximum latency of any other RRL supported by the NAND flash memory.

19. The storage medium of claim 18, wherein the maximum number of iterations is based on the maximum latency of the fast fail mode.

20. The storage medium of claim 15, wherein the NAND flash memory comprises a plurality of memory cells, each memory cell configured to store more than one bit of data.

* * * * *